(12) United States Patent
Su et al.

(10) Patent No.: US 8,384,158 B2
(45) Date of Patent: Feb. 26, 2013

(54) CHIP AND ELECTROSTATIC DISCHARGE PROTECTION DEVICE THEREOF

(75) Inventors: Yu-Ti Su, Tainan County (TW); Chung-Ti Hsu, Taipei (TW)

(73) Assignee: Nuvoton Technology Corporation, Hsinchu (TW)

( * ) Notice: Subject to any disclaimer, the term of this patent is extended or adjusted under 35 U.S.C. 154(b) by 237 days.

(21) Appl. No.: 12/904,171

(22) Filed: Oct. 14, 2010

(65) Prior Publication Data

US 2011/0121394 A1    May 26, 2011

(30) Foreign Application Priority Data

Nov. 24, 2009    (TW) .............................. 98140000 A (51) Int. Cl.
*H01L 23/62* (2006.01)
(52) U.S. Cl. ........................ 257/360; 438/231
(58) Field of Classification Search .................. 257/360; 438/231; 361/56
See application file for complete search history.

(56) References Cited

U.S. PATENT DOCUMENTS

| | | | |
|---|---|---|---|
| 4,896,243 A | 1/1990 | Chatterjee et al. | |
| 4,939,616 A | 7/1990 | Rountree | |
| 5,465,189 A | 11/1995 | Polgreen et al. | |
| 5,959,820 A | 9/1999 | Ker et al. | |
| 6,765,771 B2 | 7/2004 | Ker et al. | |
| 6,946,690 B1 | 9/2005 | Vashchenko et al. | |
| 7,542,253 B2 | 6/2009 | Ker et al. | |
| 2003/0183879 A1* | 10/2003 | Wang ........................... 257/355 |
| 2004/0100746 A1 | 5/2004 | Chen et al. | |
| 2007/0018193 A1 | 1/2007 | Ker et al. | |
| 2008/0012044 A1 | 1/2008 | Salcedo et al. | |

FOREIGN PATENT DOCUMENTS

CN    1445849    10/2003

OTHER PUBLICATIONS

Ming-Dou Ker, "ESD Protection for CMOS ASIC in Noisy Environments with High-Current Low-Voltage Triggering SCR Devices," in Proc. IEEE Int. ASIC Conf. and Exhibits, 1997, pp. 283-286.
Ming-Dou Ker and Hun-Hsien Chang, "How to Safely Apply the LVTSCR for CMOS Whole-Chip ESD Protection without being Accidentally Triggered On," in Proc. of EOS/ESD Symp., 1998,pp. 72-85.
Guido Notermans, Fred Kuper and Jan-Marc Luchies, "Using an SCR as ESD Protection Without Latch-Up Danger," Microelectronics Reliability, vol. 37, No. 10/11, pp. 1457-1460, 1997.

(Continued)

*Primary Examiner* — Shaun Campbell
(74) *Attorney, Agent, or Firm* — Jianq Chyun IP Office (57) ABSTRACT

An ESD protection device is provided, which includes a P-type doped region, an N-type doped region, a first P+ doped region, a first N+ doped region, a second N+ doped region and a third N+ doped region. The N-type doped region is located in the P-type doped region. The first P+ doped region connected to a pad is located in the N-type doped region. A part of the first N+ doped region is located in the N-type doped region and the residue part thereof is located in the P-type doped region. The second and the third N+ doped regions are located in the P-type doped region and outside the N-type doped region, and are respectively electrically connected to a first power rail and a second power rail. In addition, the second N+ doped region is located between the first and the third N+ doped regions.

16 Claims, 8 Drawing Sheets

OTHER PUBLICATIONS

Ming-Dou Ker and Zi-Ping Chen, "SCR Device With Dynamic Holding Voltage for On-Chip ESD Protection in a 0.25-μm Fully Salicided CMOS Process," IEEE Transactions on Electron Devices, vol. 51, No. 10, pp. 1731-1733, Oct. 2004.

Ming-Dou Ker, "Lateral SCR Devices with Low-Voltage High-Current Triggering Characteristics for Output ESD Protection in Submicron CMOS Technology," IEEE Transactions on Electron Devices, vol. 45, No. 4, pp. 849-860, Apr. 1998.

Ming-Dou Ker, Chung-Yu Wu and Hun-Hsien Chang, "Complementary-LVTSCR ESD Protection Circuit for Submicron CMOS VLSI/ VLSI," IEEE Transactions on Electron Devices, vol. 43, No. 4, pp. 588-598, Apr. 1996.

Ming-Dou Ker, "Electrostatic Discharge (ESD) Protection for CMOS Output Buffers in Scaled-Down VLSI Technology," Microelectron. Reliab., vol. 38, No. 4, pp. 619-639, 1998.

Ming-Dou Ker and Kun-Hsien Lin, "ESD Protection Design for I/O Cells With Embedded SCR Structure as Power-Rail ESD Clamp Device in Nanoscale CMOS Technology," IEEE Journal of Solid-State Circuits, vol. 40, No. 11, pp. 2329-2338, Nov. 2005.

"Office Action of Taiwan Counterpart Application", issued on Nov. 24, 2011, p. 1-4, in which the listed reference was cited.

* cited by examiner

CHIP AND ELECTROSTATIC DISCHARGE PROTECTION DEVICE THEREOF

CROSS-REFERENCE TO RELATED APPLICATION

This application claims the priority benefit of Taiwan application serial no. 98140000, filed on Nov. 24, 2009. The entirety of the above-mentioned patent application is hereby incorporated by reference herein and made a part of this specification.

BACKGROUND OF THE INVENTION

1. Field of the Invention

The present invention generally relates to electrostatic discharge (ESD) technique, and more particularly, to an ESD protection device.

2. Description of Related Art

Usually, an ESD voltage or an ESD current is much higher than the power voltage or the power current required by a normal operation. In a real application environment, ESD from various sources can impact an electronic product. When an ESD occurs suddenly, the accompanied ESD current likely damages the devices within a moment.

In order to overcome the above-mentioned problem, an ESD protection circuit is usually implemented in the IC circuit so as to effectively isolate the above-mentioned circuit from the ESD current to avoid the devices from damage, wherein a silicon-controlled rectifier (SCR) protection circuit is often used one. However, the currently available SCR protection circuit may cause latch-up problem. In this regard, how to solve the latch-up problem caused by SCR is really a task to be resolved.

SUMMARY OF THE INVENTION

According to an embodiment of the present invention, an ESD protection device includes a P-type doped region, an N-type doped region, a first P+ doped region, a first N+ doped region, a second N+ doped region and a third N+ doped region. The N-type doped region is located in the P-type doped region. The first P+ doped region is located in the N-type doped region and electrically connected to a pad. The first N+ doped region is located between the P-type doped region and the N-type doped region, a portion of the first N+ doped region is located in the N-type doped region and the residue portion of the first N+ doped region is located in the P-type doped region. The second N+ doped region is located in the P-type doped region and outside the N-type doped region, and is electrically connected to a first power rail. In addition, the third N+ doped region is located in the P-type doped region and outside the N-type doped region and is electrically connected to a second power rail, wherein the second N+ doped region is located between the first N+ doped region and the third N+ doped region.

According to an embodiment of the present invention, a chip includes a core circuit, a first power rail, a second power rail and a plurality of pad units surrounding the core circuit. Each of the pad units includes a pad and an above-mentioned ESD protection device, wherein the pad is electrically connected to the core circuit, the ESD protection device is disposed beside the pad and electrically connected to the first power rail and the second power rail. The ESD protection device in each of the pad units herein is connected in parallel between the first power rail and the second power rail.

According to an embodiment of the present invention, an ESD protection device includes a second power rail, a P-type doped region, an N-type doped region, a first P+ doped region, a pad, a first N+ doped region, a second N+ doped region, a first power rail and a third N+ doped region. The voltage of the second power rail is lower than the voltage of the first power rail. The P-type doped region is electrically connected to the second power rail. The N-type doped region is located in the P-type doped region. The first P+ doped region is located at the N-type doped region. The pad is electrically connected to the N-type doped region and the first P+ doped region. The first N+ doped region is located between the P-type doped region and the N-type doped region, and a portion of the first N+ doped region is located in the N-type doped region while the residue part thereof is located in the P-type doped region. The second N+ doped region is located in the P-type doped region and outside the N-type doped region. The first power rail is electrically connected to the second N+ doped region. The third N+ doped region is electrically connected to the second power rail, wherein the third N+ doped region is located in the P-type doped region and outside the N-type doped region, and the second N+ doped region is located between the first N+ doped region and the third N+ doped region.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Reference will now be made in detail to the present embodiments of the invention, examples of which are illustrated in the accompanying drawings. Wherever possible, the same reference numbers are used in the drawings and the description to refer to the same or like parts.

Figure 1:
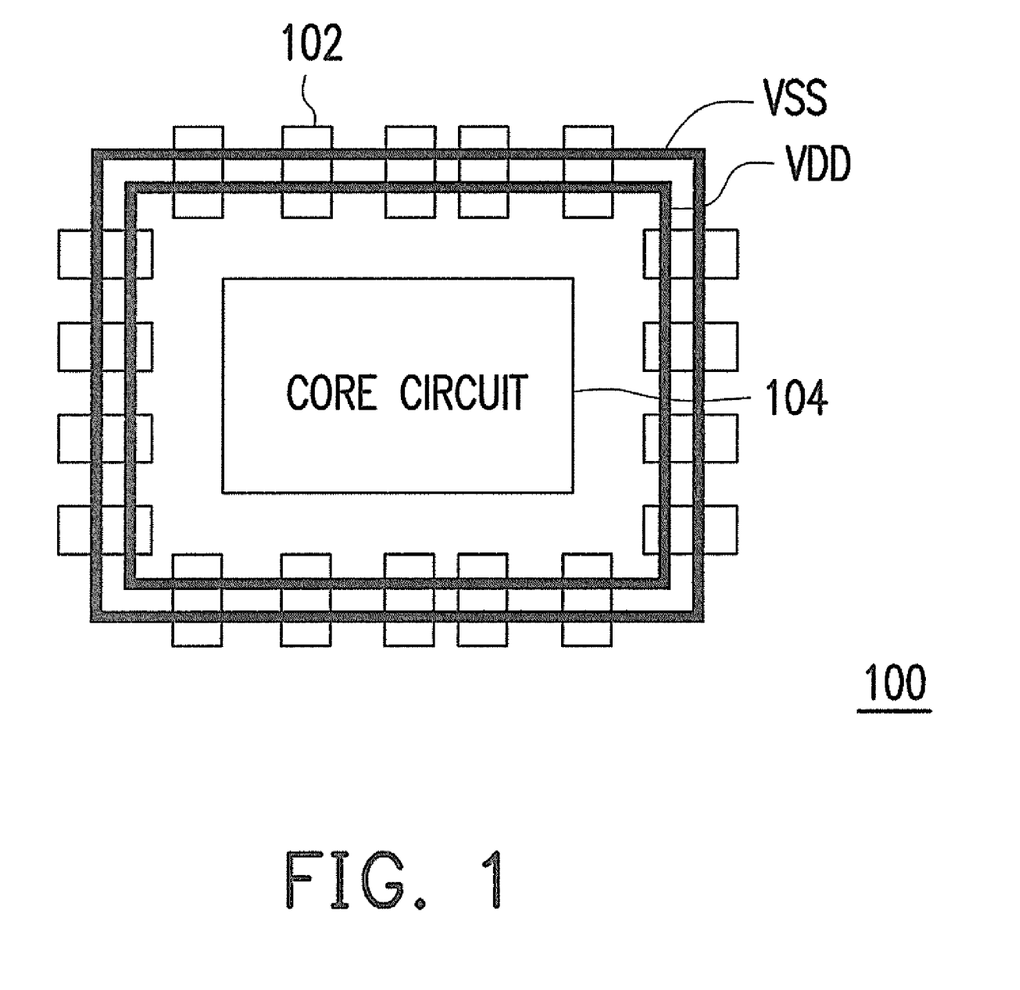
FIG. 1 is a chip diagram according to an embodiment of the present invention.

FIG. 1 is a chip diagram according to an embodiment of the present invention. Referring to FIG. 1, a chip 100 includes a plurality of pad units 102 and a system voltage rail VDD and a grounding rail VSS respectively electrically connected to each of the pad units 102. Each of the pad units 102 can be an input/output pad unit, a system voltage pad unit or a grounding pad unit. Each of the pad units 102 respectively has a pad and an ESD protection device, wherein each ESD protection device is disposed beside the corresponding pad. The pad in the system voltage pad unit is electrically connected to a first power rail (for example, the system voltage rail VDD), so that the external system is able to transmit the system voltage to the system voltage rail VDD. The pad in the grounding pad unit is electrically connected to a second power rail (for example, the grounding rail VSS), so that the external system is able to transmit the grounding voltage to the grounding rail VSS. By means of the transmissions of the system voltage rail VDD and the grounding rail VSS, the external system is able to provide an operation electrical energy to a core circuit 104. The pad I/O in the input/output pad unit is electrically connected to the core circuit 104, so that the external system is able to transmit a data signal to the core circuit 104 through the pad I/O or obtain a data signal output from the core circuit 104 through the pad I/O.

The ESD protection device in input/output pad units can be implemented referring to FIGS. 2A-2C, 3, 4, 5A-5B and 6A-6B. The ESD protection devices are respectively electrically connected to a corresponding pad and to the system voltage rail VDD and the grounding rail VSS. Taking an input/output pad unit as example, when an ESD event occurs on the pad I/O of the input/output pad unit, the ESD protection device of the input/output pad unit is able to immediately conduct the massive electrostatic current to the system voltage rail VDD and/or grounding rail VSS from the pad I/O so as to protect the core circuit 104 in the chip 100.

Figure 2A:
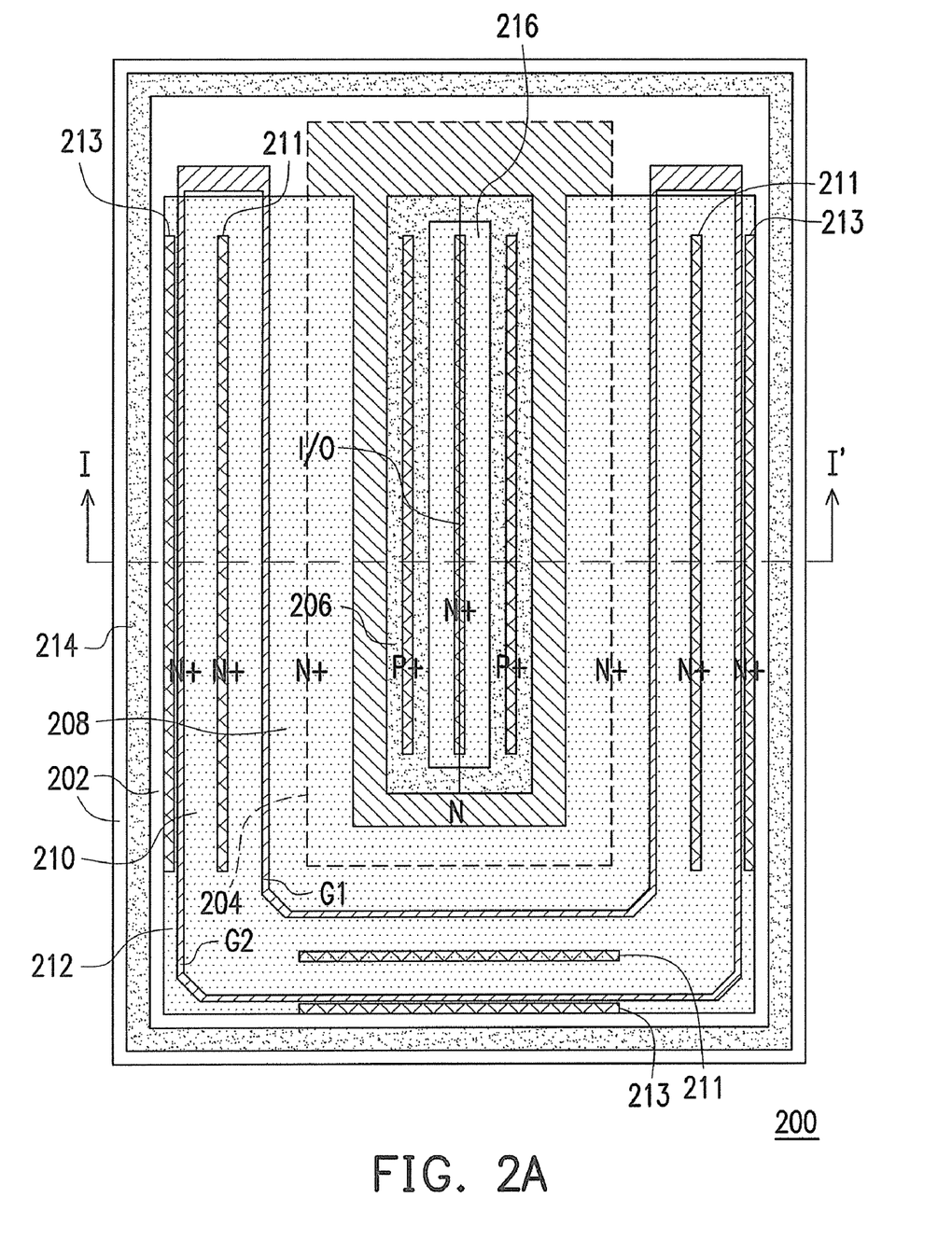
FIG. 2A is a top view diagram showing an ESD protection device according to an embodiment of the present invention.
Figure 2B:
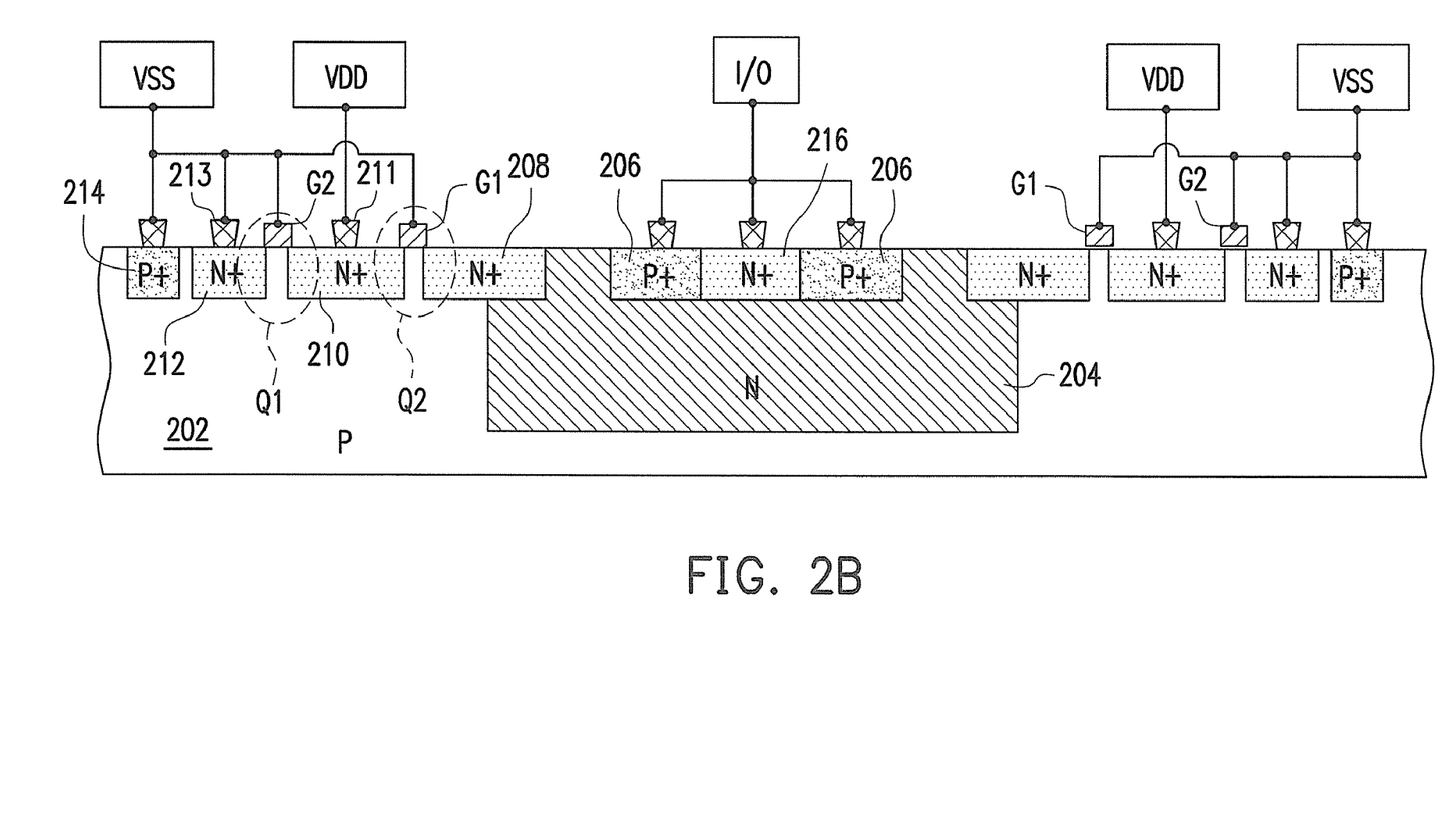
FIG. 2B is a sectional view along Line I-I' in FIG. 2A.

FIG. 2A is a top view diagram showing an ESD protection device according to an embodiment of the present invention, and FIG. 2B is a sectional view along Line I-I' in FIG. 2A. Referring to FIGS. 2A and 2B, the ESD protection device 200 includes a P-type doped region 202, an N-type doped region 204, a first P+ doped region 206, a first N+ doped region 208, a second N+ doped region 210, a third N+ doped region 212, a second P+ doped region 214 and a fourth N+ doped region 216. The first N+ doped region 208, the second N+ doped region 210 and the third N+ doped region 212 are arranged in U-shape surrounding the first P+ doped region 206. The N-type doped region 204 is disposed in the P-type doped region 202. The P-type doped region 202 can be a P-type substrate, and the N-type doped region 204 can be an N-type well region. In addition, the P-type doped region 202 and the N-type doped region 204 can be respectively a P-type well region and an N-type well region, and anyone skilled in the art can implement the P-type doped region 202 and the N-type doped region 204 by using any technique or process, for example, the P-type doped region 202 can be implemented by using a high-voltage P-well (HVPW), the N-type doped region 204 can be implemented by using a high-voltage N-well (HVNW) or a N-type heavily doped drain (NHDD).

The first P+ doped region 206 is disposed in the N-type doped region 204 and electrically connected to a pad I/O. The first N+ doped region 208 can be disposed between the P-type doped region 202 and the N-type doped region 204. A part of the first N+ doped region 208 can be located in the P-type doped region 202, and the residue part of the first N+ doped region 208 can be located in the N-type doped region 204. The second N+ doped region 210 and the third N+ doped region 212 are disposed in the P-type doped region 202 and outside the N-type doped region 204, wherein the second N+ doped region 210 is located between the third N+ doped region 212 and the first N+ doped region 208. The second N+ doped region 210 and the third N+ doped region 212 are respectively electrically connected to a first power rail (for example, the system voltage rail VDD) and a second power rail (for example, the grounding rail VSS) through two contact plugs 211 and 213. The voltage of the second power rail is lower than the voltage of the first power rail. The second P+ doped region 214 is disposed in the P-type doped region 202 and outside the N-type doped region 204. The P-type doped region 202 is electrically connected to the grounding rail VSS through the second P+ doped region 214. The above-mentioned third N+ doped region 212 is located between the second P+ doped region 214 and the second N+ doped region 210. In the embodiment, the second P+ doped region 214 surrounds the ESD protection device 200 to form a guard ring. The fourth N+ doped region 216 is disposed in the N-type doped region 204 and adjacent to the first P+ doped region 206 and electrically connected to the pad I/O. Besides, the layout structure of the ESD protection device 200 further includes a first gate structure G1 and a second gate structure G2. The first gate structure G1 and the second gate structure G2 respectively include a gate and a gate dielectric layer. The gate structures G1 and G2 are electrically connected to the grounding rail VSS.

Figure 2C:
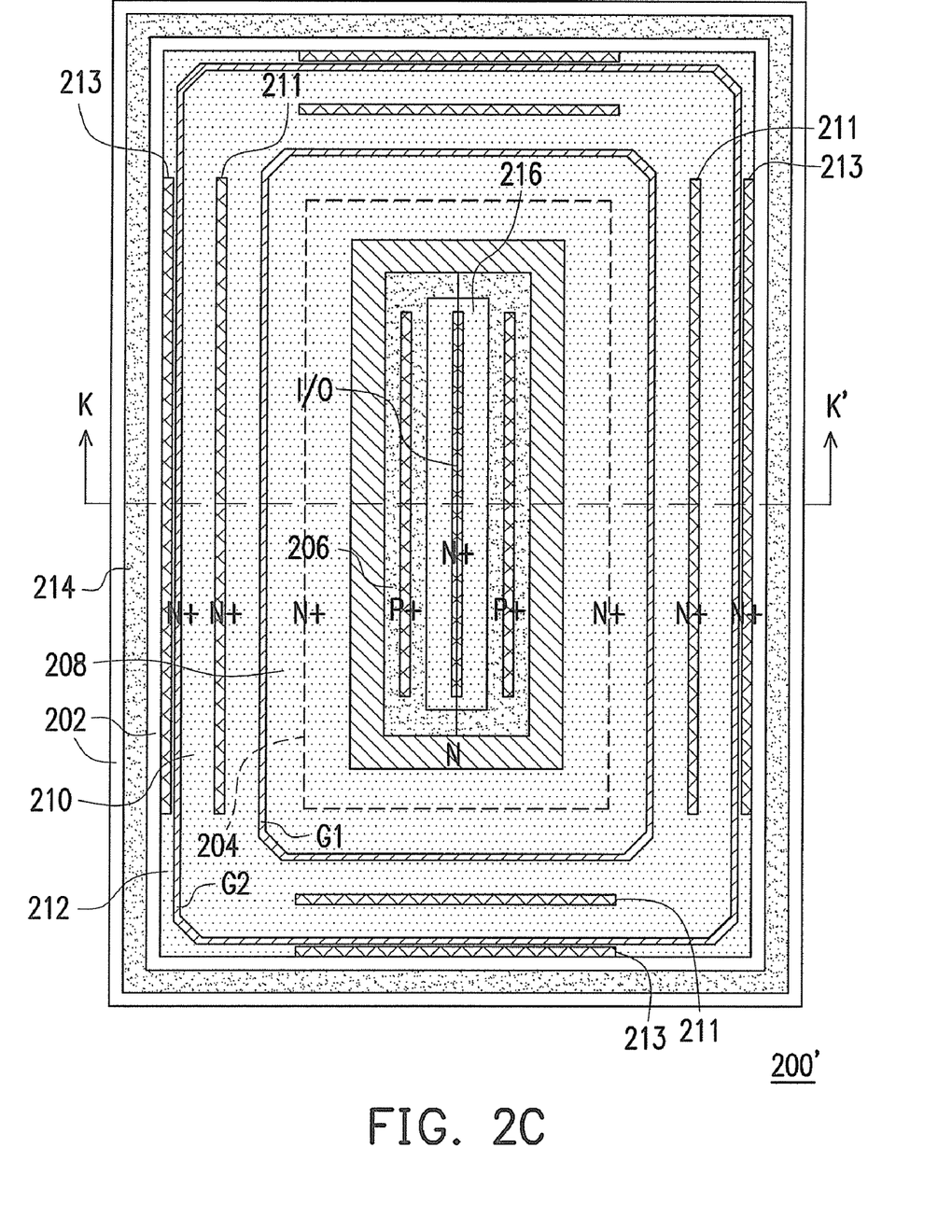
FIG. 2C is a top view diagram showing an ESD protection device according to another embodiment of the present invention.

FIG. 2C is a top view diagram showing an ESD protection device according to another embodiment of the present invention. Different from the ESD protection device of FIG. 2A, the first N+ doped region 208, the second N+ doped region 210 and the third N+ doped region 212 in a ESD protection device 200' of FIG. 2C are arranged in ring shape surrounding the first P+ doped region 206, however the sectional view along Line K-K' in FIG. 2C is the same as the one in FIG. 2B, the structure details thereof are the same as FIG. 2B and are omitted to describe. In following, in association with FIG. 2B, the ESD protection device would be described in more details.

Figure 3:
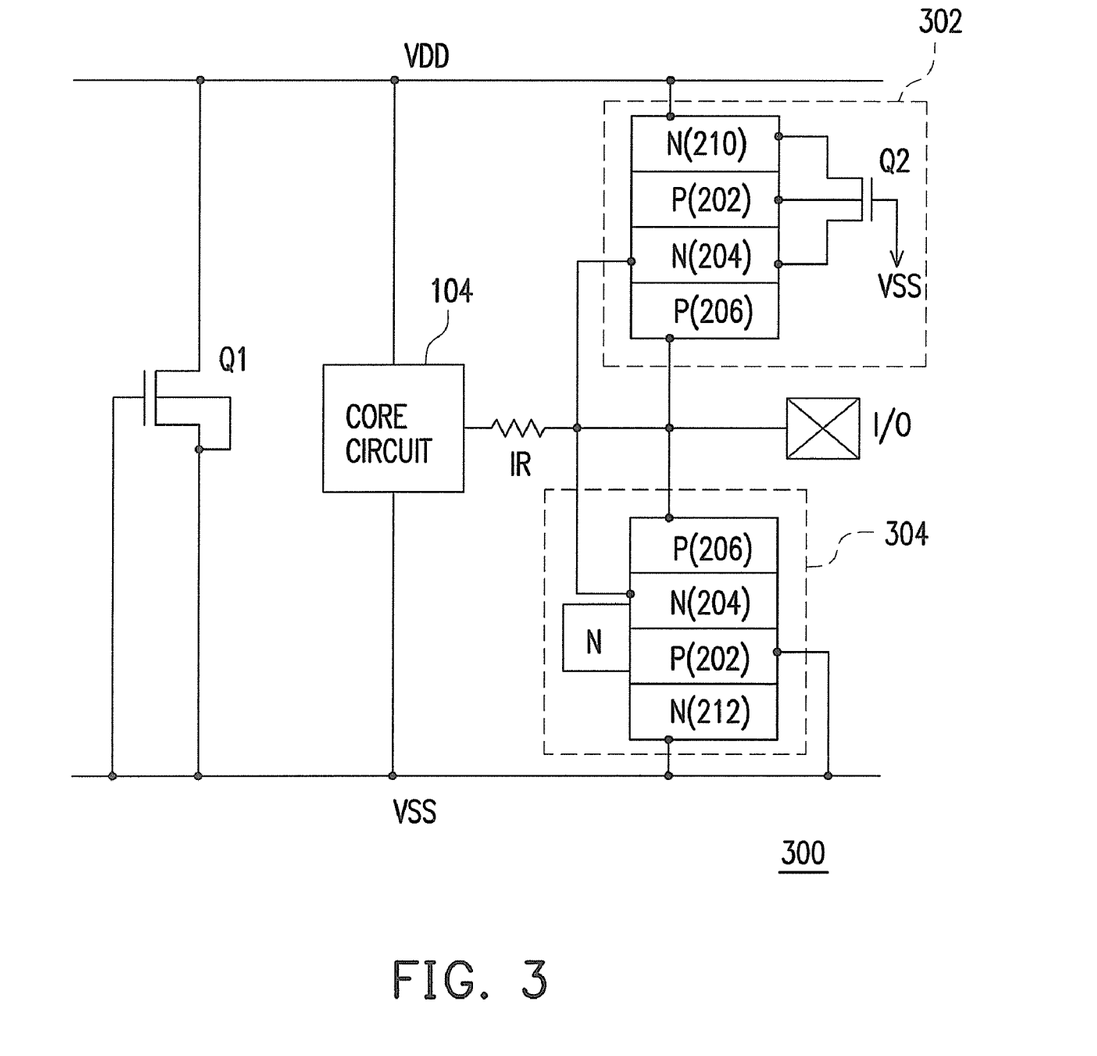
FIG. 3 is an equivalent circuit diagram of the ESD protection device of FIG. 2B.

FIG. 3 is an equivalent circuit diagram of the ESD protection device of FIG. 2B. An ESD protection device 300 includes a transistor Q1, a first silicon-controlled rectifier 302 and a second silicon-controlled rectifier 304. Referring to FIGS. 2B and 3, the transistor Q1 herein can be an N-type metal-oxide-semiconductor field-effect transistor (NMOS transistor). The NMOS transistor includes the second N+ doped region 210, the third N+ doped region 212, the second gate structure G2 and the P-type doped region 202. The gate and the source of the transistor Q1 are electrically connected together, thereby, the transistor Q1 can be substantially equivalent to a diode.

The structure of the first silicon-controlled rectifier 302 from the anode to the cathode thereof is sequentially P, N, P and N, which are respectively corresponding to the first P+ doped region 206, the N-type doped region 204 (in more details, i.e., the N-type doped region 204 and the first N+ doped region 208), the P-type doped region 202 and the second N+ doped region 210 in FIG. 2B. The NMOS transistor Q2 connected to the first silicon-controlled rectifier 302 includes the first N+ doped region 208, the first gate structure G1, the second N+ doped region 210 and the P-type doped region 202. In addition, the structure of the second silicon-controlled rectifier 304 from the anode to the cathode thereof is sequentially P, N, P and N, which are respectively corresponding to the first P+ doped region 206, the N-type doped region 204, the P-type doped region 202 and the third N+ doped region 212 in FIG. 2B. The N-type doped region between the N-type doped region 204 and the P-type doped region 202 in the second silicon-controlled rectifier 304 is corresponding to the first N+ doped region 208. The pad I/O is electrically connected to the core circuit 104 through a resistor IR. The core circuit 104 represents the circuit to be protected, the operation power is provided by the system voltage rail VDD and the grounding rail VSS, and the pad I/O can be one of the node of the core circuit 104 in charge of outputting/inputting signals.

By sharing the first P+ doped region 206, the N-type doped region 204 and the P-type doped region 202, the first silicon-controlled rectifier 302 and the second silicon-controlled rectifier 304 can be integrated into the ESD protection device 200 as shown in FIG. 2B, wherein the area of the ESD protection device 200 is largely saved by sharing the doped regions 206, 204 and 202.

There are several testing modes for the ESD protection device, i.e., PD mode, PS mode, ND mode, NS mode, voltage source VDD terminal mode and voltage source VSS terminal mode. The PD mode is that a positive ESD voltage (positive charges) is applied on the pad and the system voltage rail VDD is grounded; the ND mode is that a negative ESD voltage (negative charges) is applied on the pad and the system voltage rail VDD is grounded; the PS mode is that a positive ESD voltage (positive charges) is applied on the pad and the grounding rail VSS is grounded; the NS mode is that a negative ESD voltage (negative charges) is applied on the pad and the grounding rail VSS is grounded; the voltage source VDD terminal mode is that a positive ESD voltage (positive charges) is applied on the VDD pad and the grounding rail VSS is grounded; the voltage source VSS terminal mode is that a negative ESD voltage (negative charges) is applied on the VDD pad and the grounding rail VSS is grounded. Each of the testing modes is described in more details in following in association with FIGS. 2B and 3.

The PS mode. When a positive ESD voltage (positive charges) is applied on the pad I/O, the positive ESD voltage can cause avalanche breakdown occur at the PN junction between the first N+ doped region 208 and the P-type doped region 202 and thereby the pulse current caused by the ESD voltage flows sequentially through the first P+ doped region 206, the N-type doped region 204, the first N+ doped region 208, the P-type doped region 202 and the third N+ doped region 212 (i.e., sequentially flows through the second silicon-controlled rectifier 304) and finally flows out of the integrated circuit (IC) through the contact plug 213 and the grounding rail VSS so as to protect the core circuit 104. In addition, by disposing the fourth N+ doped region 216, the pulse current can easier flow from the first P+ doped region 206 to the N-type doped region 204 (i.e., from the first P+ doped region 206 to the fourth N+ doped region 216 and then to the N-type doped region 204) and finally flows out of the IC through the above-mentioned path. It should be noted that in addition to the above-mentioned path for conduct the current to the grounding rail VSS and out of the IC, the above-mentioned pulse current can also directly from the fourth N+ doped region 216 flow through the N-type doped region 204, the first N+ doped region 208, the P-type doped region 202, then the second P+ doped region 214 in the P-type doped region 202 to the grounding rail VSS so as to protect the core circuit 104. The N-type doped region 204 can be electrically connected to the pad I/O through the fourth N+ doped region 216.

The NS mode. When a negative ESD voltage is applied on the pad I/O, since the PN junction between the N-type doped region 204 and the P-type doped region 202 carries a forward bias voltage so that the pad I/O can drain the current from the grounding rail VSS through the path of the second P+ doped region 214, the P-type doped region 202, the N-type doped region 204 and the fourth N+ doped region 216, which prevents the negative ESD voltage from directly impacting the core circuit 104.

The PD mode. When a positive ESD voltage is applied on the pad I/O, due to the grounded system voltage rail VDD, the positive ESD voltage can cause breakdown occur at the PN junction between the first N+ doped region 208 and the P-type doped region 202 and thereby the pulse current caused by the positive ESD voltage flows sequentially through the first P+ doped region 206, the N-type doped region 204, the first N+ doped region 208, the P-type doped region 202 and the second N+ doped region 210 (i.e., sequentially flows through the first silicon-controlled rectifier 302) and finally flows out of the IC through the contact plug 211 and the system voltage rail VDD so as to protect the core circuit 104. In addition, the pulse current caused by the positive ESD voltage can flow to the system voltage rail VDD through the path of the fourth N+ doped region 216, the N-type doped region 204, the first N+ doped region 208, the P-type doped region 202 and then the second N+ doped region 210 in the P-type doped region 202, which functions also to protect the core circuit 104.

The ND mode. When a negative ESD voltage is applied on the pad I/O, due to the grounded system voltage rail VDD, the ESD voltage can cause breakdown occur at the PN junction between the P-type doped region 202 and the second N+ doped region 210 and the pad I/O at the time would drain the current from the system voltage rail VDD through the first silicon-controlled rectifier 302 (i.e. through the path of the second N+ doped region 210, the P-type doped region 202, the N-type doped region 204 and the fourth N+ doped region 216). The current to be drained can take another path of the conductive transistor Q1, then the second silicon-controlled rectifier 304 (i.e., from the system voltage rail VDD to the second N+ doped region 210, the P-type doped region 202, the third N+ doped region 212, the contact plug 213, the grounding rail VSS, the second P+ doped region 214, the P-type doped region 202, the N-type doped region 204 and then the fourth N+ doped region 216) and finally the pad I/O where the drained current is collected.

The voltage source VDD terminal mode. When a positive ESD voltage is present at the system voltage rail VDD, the positive ESD voltage can cause breakdown occur at the PN junction between the second N+ doped region 210 and the P-type doped region 202 and thereby the pulse current caused by the ESD voltage flows sequentially through the third N+ doped region 212 and/or the second P+ doped region 214 and then the grounding rail VSS. In other words, the pulse current can be conducted to the grounding rail VSS through the transistor Q1 so as to protect the core circuit 104.

The voltage source VSS terminal mode. When a negative ESD voltage is present at the system voltage rail VDD, due to the grounded grounding rail VSS, the diode equivalent by the transistor Q1 carries a forward bias voltage. The system voltage rail VDD at the time can drain the current from the grounding rail VSS through the transistor Q1. In other word, the pulse current can flow to the system voltage rail VDD from the grounding rail VSS through the second P+ doped region 214, the P-type doped region 202 and the second N+ doped region 210 so as to protect the core circuit 104 from being impacted by the negative ESD voltage.

In some of the embodiments of present invention, the ESD protection device 200 does not include the fourth N+ doped region 216, where the user can select appropriate implementations according to the application practice to realize the ESD protection device 200 so as to save the production cost of the ESD protection device 200.

TABLE 1 transmission line pulse testing result of ESD protection device

| electrostatic testing mode | PS | PD | ND | NS | VDD | VSS |
|---|---|---|---|---|---|---|
| triggering voltage Vtr(V) | 12.67 | 8.67 | 8.25 | forward | 9.79 | forward |
| triggering current Itr(mA) | 30 | 1.26 | 1.19 | | 95 | |
| holding voltage Vh(V) | 8.48 | 2.52 | 6.74 | | 6.44 | |
| holding current Ih(A) | 0.219 | 0.156 | 0.031 | | 0.095 | |
| secondary breakdown voltage Vt2(V) | 42.3 | 25.1 | 20.7 | | 16 | |
| secondary breakdown current It2(A) | 7 | 7.23 | 2.14 | | 2.67 | |

Table 1 shows the transmission line pulse (TLP) testing result of the ESD protection device 200 of FIG. 2A, wherein the device under tested has a size of 55 μm×80 μm.

It can be seen from Table 1 that the holding voltages of the ESD protection device 200 under the PS testing mode, the ND testing mode and the voltage source VDD terminal mode can be increased to 8.48V, 6.74V and 6.44V, respectively. Considering the electronic apparatus is regularly operated at or lower than 3.3V, the ESD protection device of the present embodiment can effectively prevent the latch-up effect and avoid the electronic apparatus from being burn. Continuing to Table 1, under the PD mode (system voltage rail VDD is ground), the holding voltage of the above-mentioned device is 2.52V. Although the holding voltage is 2.52V, however, the latch-up effect will not be occurred on electronic apparatus during the normal operation since the voltage level of system voltage rail VDD will not be grounded (or lower than the voltage of I/O pad) during the normal operation. Thereby, the ESD protection device 200 of the embodiment can effectively prevent the latch-up effect and the chip 100 is protected by good ESD protection. Under the NS mode, the electrostatic current takes the direction of the forward bias and flows through the PN junction between the P-type doped region 202 and the N-type doped region 204, which does not trigger the second silicon-controlled rectifier 304. Similarly, under the voltage source VSS terminal mode, the electrostatic current takes the direction of the forward bias and flows through the PN junction between the P-type doped region 202 and the second N+ doped region 210, which does not trigger the silicon-controlled rectifiers 302 and 304.

Continuing to Table 1 again, the triggering voltage of the ESD protection device 200 of the above-mentioned embodiment ranges between 8V and 12V so as to fast conduct the electrostatic charges when an ESD occurs. In addition, the ESD protection device 200 of the above-mentioned embodiment under the PS mode and the PD mode has also a high secondary breakdown current so as to have excellent ESD capability.

Table 2 shows the HBM (human body mode) testing result of ESD protection device 200 described in FIG. 2A. It can be seen from Table 2 that when the device has a size of 54 μm×80 μm, the HBM levels corresponding to various modes can reach 5 kV-8 kV, which meets the design requirements of the most ESD protection devices. When the size is increased to 55 μm×132 μm, the result of the HBM testing can reach 8 kV.

TABLE 2

HBM testing result of ESD protection device

| size | PS | PD | ND | NS | VDD | VSS |
|---|---|---|---|---|---|---|
| 55 μm × 80 μm | 8 KV | 8 KV | 5 KV | 8 KV | 5.5 KV | 8 KV |
| 55 μm × 132 μm | 8 KV | 8 KV | 8 KV | 8 KV | 8 KV | 8 KV |

Figure 4:
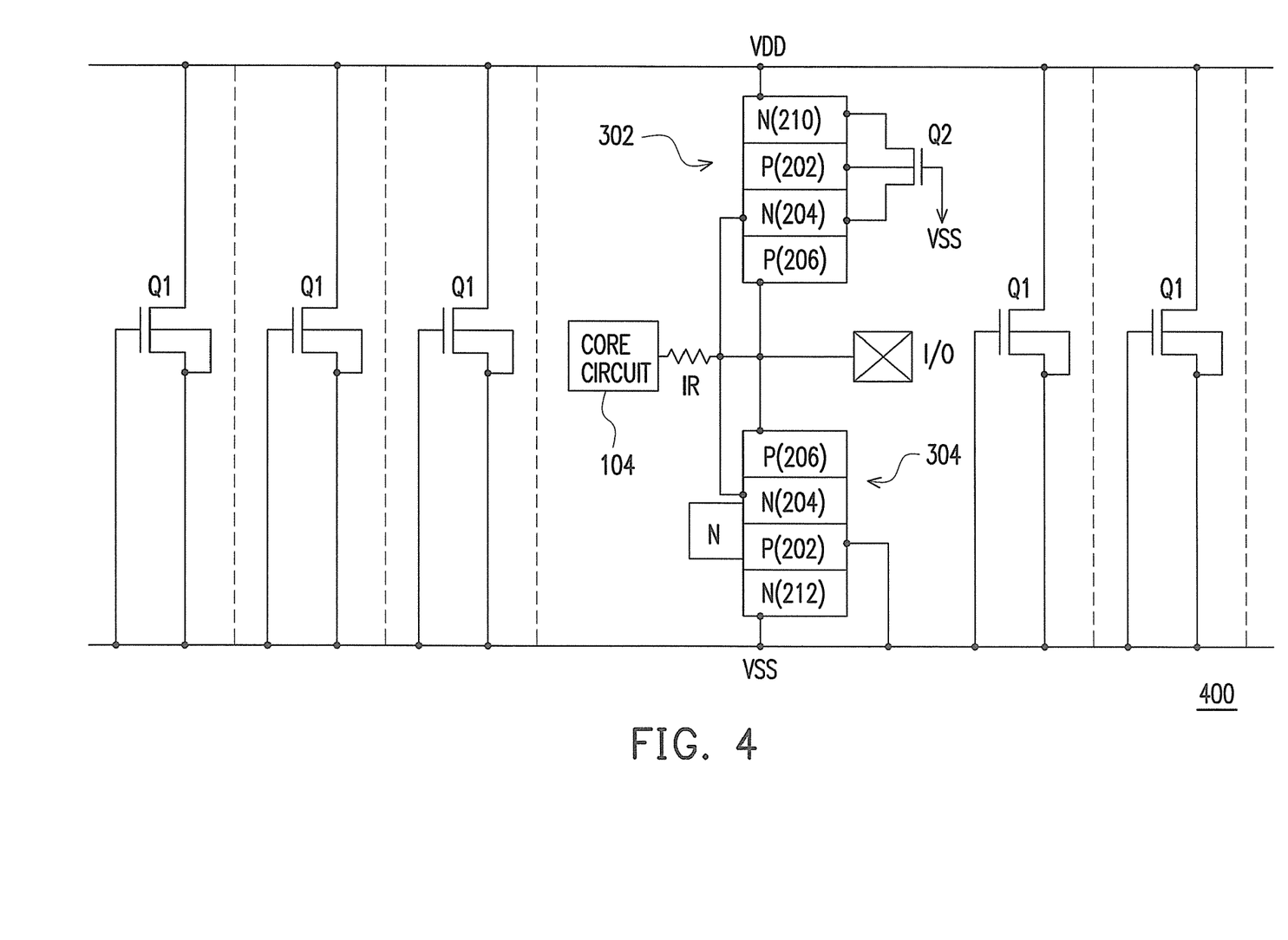
FIG. 4 is the ESD protection circuit diagram of the chip of the FIG. 1.

FIG. 4 is the ESD protection circuit diagram of the chip of the FIG. 1. Referring to FIGS. 1 and 4, the ESD protection circuit 400 has a plurality of transistors Q1 connected in parallel together. Because each pad unit 102 of the chip 100 has respectively an ESD protection circuit 300, and the transistors Q1 of the ESD protection circuits 300 in the pad units 102 can be commonly used, so that the ESD protection circuit 300 corresponding to each pad unit 102 is substantially equivalent to a plurality of transistors Q1 connected in parallel together (for example, the ESD protection circuit 400 shown in FIG. 4). By using the plurality of transistors Q1 connected in parallel together, the endurance capacity of the chip against the ESD voltage is improved, which is advantageous to eliminate the ESD voltage present on the system voltage rail VDD. Since each pad unit 102 in FIG. 1 can respectively employ an ESD protection circuit 300 so that there are many transistors Q1 connected in parallel together between the system voltage rail VDD and the grounding rail VSS, which can increase the endurance capacity of the chip against the ESD voltage (for example, the secondary breakdown current is increased). In this way, the area of the transistor Q1 can be saved so that there is no need to dispose an additional power clamp device surrounding the chip 100, which is advantageous in largely saving the area of the IC and reducing the production cost.

Figure 5A:
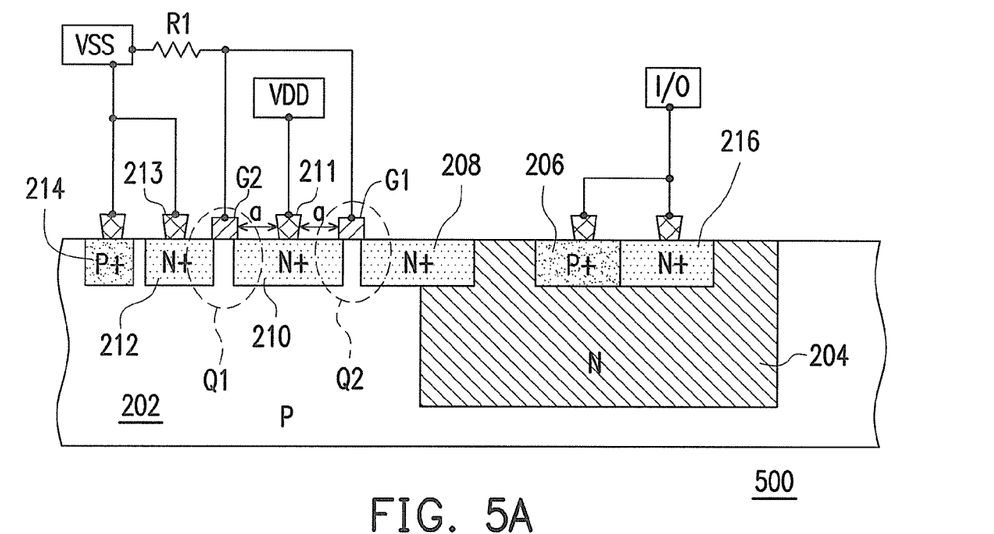
FIG. 5A is a diagram showing an ESD protection device according to yet another embodiment of the present invention.
Figure 5B:
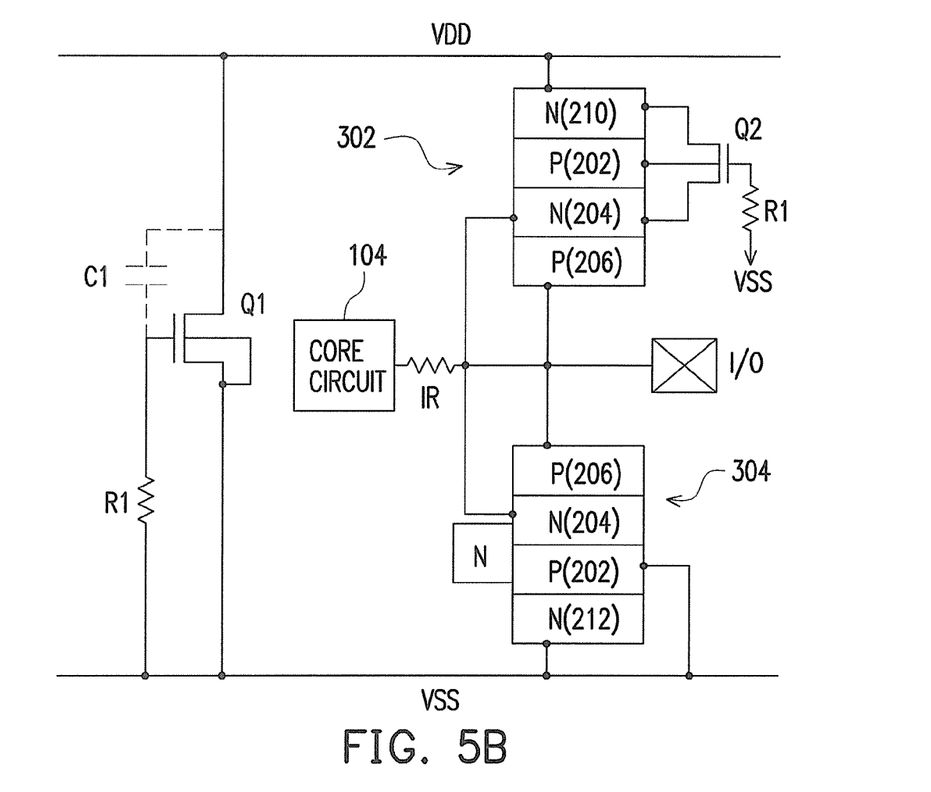
FIG. 5B is an equivalent circuit diagram of the ESD protection device of FIG. 5A.

FIG. 5A is a diagram showing an ESD protection device according to yet another embodiment of the present invention and FIG. 5B is an equivalent circuit diagram of the ESD protection device of FIG. 5A. Referring to FIGS. 5A and 5B, it is different from FIGS. 2B and 3 that the ESD protection device 500 in the embodiment further includes a resistor R1 coupled between the grounding rail VSS and the gate structures G1 and G2. By disposing the resistor R1, the voltages of the gate structures G1 and G2 can be easier pulled high so that the channel covered by the gate structures G1 and G2 can easier be turned on to improve the ESD protection effect of the device. Continuing to FIGS. 5A and 5B, the resistor R1 of the embodiment can be implemented by any scheme, for example, the resistor R1 can be a poly-Si resistor, a diffusion resistor or a MOS resistor. A parasitic capacitor C1 (as shown in FIG. 5B) is formed between the second N+ doped region 210 and the gate of the transistor Q1, wherein the parasitic capacitor C1 is formed by two parasitic capacitors connected in series. The first parasitic capacitor is formed by the second N+ doped region 210 and the P-type doped region 202, and the second parasitic capacitor is formed by the second gate structure G2 and the P-type doped region 202 covered by the second gate structure G2. The parasitic capacitor C1 and the resistor R1 together form an ESD detection circuit. Under the voltage source VDD terminal mode, when a positive ESD voltage is presented on the system voltage rail VDD, the ESD voltage is coupled to the gate of the transistor Q1 through the parasitic capacitor C1. The pulse voltage coupled to the gate of the transistor Q1 turns on the channel of the transistor Q1. In this way, the pulse current caused by the positive ESD voltage can be conducted out of the IC from the system voltage rail VDD through the transistor Q1 and the grounding rail VSS.

Figure 6A:
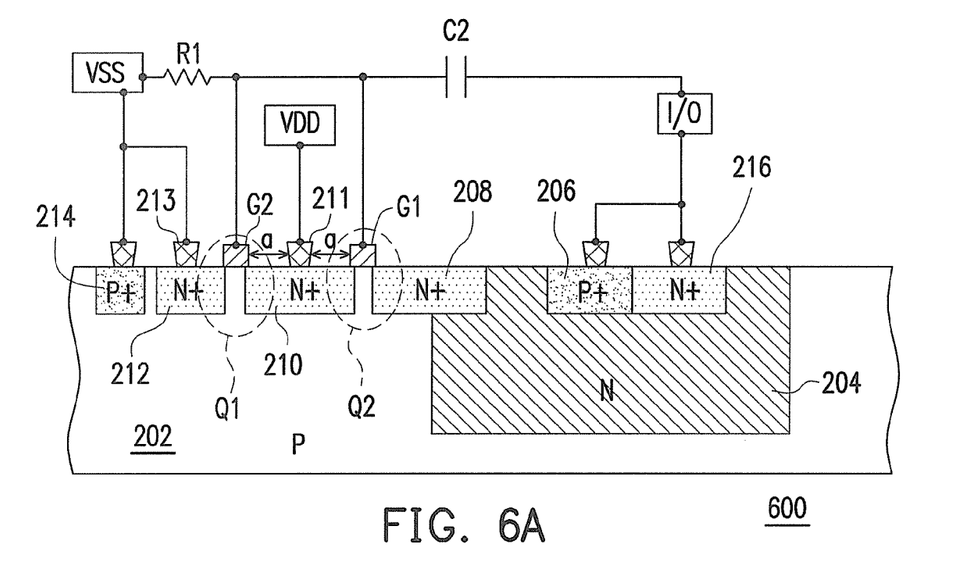
FIG. 6A is a diagram showing an ESD protection device according to yet another embodiment of the present invention.
Figure 6B:
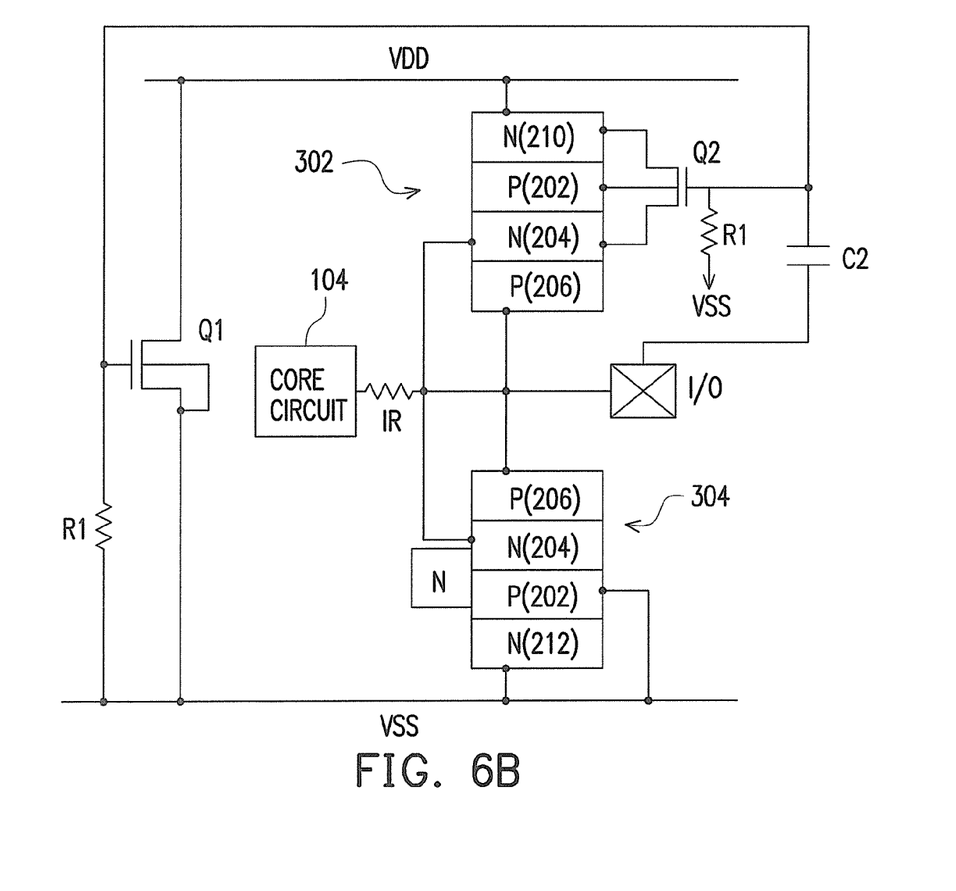
FIG. 6B is an equivalent circuit diagram of the ESD protection device of FIG. 6A.

FIG. 6A is a diagram showing an ESD protection device according to yet another embodiment of the present invention and FIG. 6B is an equivalent circuit diagram of the ESD protection device of FIG. 6A. Referring to FIGS. 6A and 6B, different from the ESD protection device 500, the ESD protection device 600 in the embodiment further includes a capacitor C2 coupled between the gate structure G1 and the pad I/O. The capacitor C2 of the embodiment can be implemented by any scheme, for example, the capacitor C2 can be a MIM-type capacitor. The capacitor C2 and the resistor R1 together form an ESD protection circuit. Under the PD mode, when a positive ESD voltage is applied on the pad I/O, the ESD voltage is coupled to the gates of the transistors Q1 and Q2 so as to turn on the transistors Q1 and Q2. Usually, the speed to turn on the transistors Q1 and Q2 is faster than the speed of breakdown occurred at the PN junction, so that the pulse current caused by the positive pulse voltage can be drained out of the IC through the path of the first silicon-controlled rectifier 302, the transistor Q1 (i.e., through the first P+ doped region 206, the N-type doped region 204, the first N+ doped region 208 and the second N+ doped region 210) and then the system voltage rail VDD.

In summary, the above-mentioned embodiments use the layout structure of the first P+ doped region 206, the first N+ doped region 208, the second N+ doped region 210 and the third N+ doped region 212, which increase the holding voltage of the ESD protection device and avoids the latch-up effect.

It will be apparent to those skilled in the art that the descriptions above are several preferred embodiments of the present invention only, which does not limit the implementing range of the present invention. Various modifications and variations can be made to the structure of the present invention without departing from the scope or spirit of the invention.

What is claimed is:

1. An electrostatic discharge (ESD) protection device, comprising:
    a P-type doped region;
    an N-type doped region, located in the P-type doped region;
    a first P+ doped region, located in the N-type doped region and electrically connected to a pad;
    a first N+ doped region, located between the P-type doped region and the N-type doped region, wherein a portion of the first N+ doped region is located in the N-type doped region and a residue portion is located in the P-type doped region;
    a second N+ doped region, located in the P-type doped region and outside the N-type doped region, wherein the second N+ doped region is electrically connected to a first power rail;
    a third N+ doped region, located in the P-type doped region and outside the N-type doped region, wherein the third N+ doped region is electrically connected to a second power rail and the second N+ doped region is located between the first N+ doped region and the third N+ doped region;
    a first gate structure located on the P-type doped region and between the first N+ doped region and the second N+ doped region, wherein the first gate structure is electrically connected to the second power rail, and the first gate structure, the first N+ doped region, the second N+ doped region and the P-type doped region together form an N-type metal-oxide-semiconductor (NMOS) field-effect transistor; and
    a second gate structure located on the P-type doped region and between the second N+ doped region and the third N+ doped region, wherein the second gate structure is electrically connected to the second power rail, and the second gate structure, the second N+ doped region, the third N+ doped region and the P-type doped region together form an NMOS field-effect transistor.

2. The ESD protection device as claimed in claim 1, wherein the P-type doped region is a P-type well region.

3. The ESD protection device as claimed in claim 1, wherein the N-type doped region is an N-type well region, a high-voltage N well (HVNW) or an N-type heavily doped drain (NHDD).

4. The ESD protection device as claimed in claim 1, further comprising:
    a resistor, wherein the first end of the resistor is coupled to the second power rail and the second end of the resistor is coupled to the first gate structure and the second gate structure.

5. The ESD protection device as claimed in claim 4, further comprising:
    a capacitor, wherein the first terminal of the capacitor is coupled to the pad and the second terminal of the capacitor is coupled to the second end of the resistor.

6. The ESD protection device as claimed in claim 1, further comprising a second P+ doped region, wherein the second P+ doped region is located in the P-type doped region and the P-type doped region is electrically connected to the second power rail through the second P+ doped region.

7. The ESD protection device as claimed in claim 1, further comprising a fourth N+ doped region located in the N-type doped region and adjacent to the first P+ doped region.

8. The ESD protection device as claimed in claim 1, wherein the first N+ doped region, the second N+ doped region and the third N+ doped region are arranged in U-shape to surround the first P+ doped region.

9. The ESD protection device as claimed in claim 1, wherein the first N+ doped region, the second N+ doped region and the third N+ doped region are arranged in ring shape to surround the first P+ doped region.

10. A chip, comprising:
    a core circuit;
    a first power rail;
    a second power rail;
    a plurality of pad units, surrounding the core circuit, wherein each of the pad units comprises:
        a pad, electrically connected to the core circuit; and
        an ESD protection device as claimed in claim 1, disposed beside the pad and electrically connected to the first power rail and the second power rail;
    wherein the ESD protection device in each of the pad units is connected in parallel between the first power rail and the second power rail.

11. An ESD protection device, comprising:
    a second power rail;
    a P-type doped region, electrically connected to the second power rail;
    an N-type doped region, located in the P-type doped region;
    a first P+ doped region, located in the N-type doped region;
    a pad, electrically connected to the N-type doped region and the first P+ doped region;
    a first N+ doped region, located between the P-type doped region and the N-type doped region, wherein a portion of the first N+ doped region is located in the N-type doped region and a residue portion is located in the P-type doped region;

a second N+ doped region, located in the P-type doped region and outside the N-type doped region;

a first power rail, electrically connected to the second N+ doped region, wherein the voltage of the second power rail is lower than the voltage of the first power rail; and a third N+ doped region, electrically connected to the second power rail, wherein the third N+ doped region is in the P-type doped region and outside the N-type doped region, and the second N+ doped region is located between the first N+ doped region and the third N+ doped region.

12. The ESD protection device as claimed in claim 11, further comprising a second P+ doped region, wherein the second P+ doped region is located in the P-type doped region, and the P-type doped region is electrically connected to the second power rail through the second P+ doped region.

13. The ESD protection device as claimed in claim 11, further comprising a fourth N+ doped region located in the N-type doped region and adjacent to the first P+ doped region, wherein the N-type doped region is electrically connected to the pad through the fourth N+ doped region.

14. The ESD protection device as claimed in claim 11, further comprising a first gate structure and a second gate structure, wherein the first gate structure and the second gate structure are located on the P-type doped region and electrically connected to the second power rail, the first gate structure is located between the first N+ doped region and the second N+ doped region, and the second gate structure is located between the second N+ doped region and the third N+ doped region.

15. The ESD protection device as claimed in claim 14, further comprising:

a resistor, wherein the first end of the resistor is coupled to the second power rail and the second end of the resistor is coupled to the first gate structure and the second gate structure.

16. The ESD protection device as claimed in claim 15, further comprising:

a capacitor, wherein the first terminal of the capacitor is coupled to the pad and the second terminal of the capacitor is coupled to the second end of the resistor.

* * * * *